(12) United States Patent
Hayashi et al.

(10) Patent No.: US 7,223,648 B2
(45) Date of Patent: May 29, 2007

(54) METHOD FOR MANUFACTURING A SEMICONDUCTOR ELEMENT

(75) Inventors: Masahiro Hayashi, Sakata (JP); Takahisa Akira, Tsuruoka (JP); Akihiro Shiraishi, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/453,638

(22) Filed: Jun. 14, 2006

(65) Prior Publication Data

US 2006/0286733 A1 Dec. 21, 2006

(30) Foreign Application Priority Data

Jun. 17, 2005 (JP) .............................. 2005-177310

(51) Int. Cl.
*H01L 21/8238* (2006.01)
(52) U.S. Cl. ...................................... 438/199; 438/195
(58) Field of Classification Search ................ 438/199, 438/195, 197
See application file for complete search history.

(56) References Cited

U.S. PATENT DOCUMENTS 6,323,075 B1 * 11/2001 Ammo et al. ............... 438/202
6,403,409 B1 * 6/2002 You ........................... 438/164

FOREIGN PATENT DOCUMENTS

| JP | 06-029313 | 2/1994 |
|----|-----------|--------|
| JP | 11-008388 | 1/1999 |

* cited by examiner

*Primary Examiner*—Theresa T. Doan
(74) *Attorney, Agent, or Firm*—Hogan & Hartson LLP (57) ABSTRACT

A method for manufacturing a semiconductor element, comprises: (1) forming a first insulating layer for electric field relaxation that is thicker than a first gate insulating layer in a first channel region of a transistor of a first conductive type that is one of P-type and N-type polarity formed on a semiconductor silicon wafer to surround an edge of a first gate electrode in order to reduce an electric field concentrated to a region surrounding the edge of the first gate electrode because of a voltage applied to the first gate electrode and a first drain region of the transistor of the first conductive type, and forming a second insulating layer for electric field relaxation that is thicker than a second gate insulating layer in a second channel region of a transistor of a second conductive type to surround the edge of the first gate electrode in order to reduce an electric field concentrated to a region surrounding an edge of a second gate electrode because of a voltage applied to the second gate electrode and a second drain region of the transistor of the second conductive type; (2) forming a first photoresist layer in an uppermost section of the wafer.

2 Claims, 10 Drawing Sheets

METHOD FOR MANUFACTURING A SEMICONDUCTOR ELEMENT

BACKGROUND

1. Technical Field

The present invention relates to a manufacturing method of a semiconductor element which has insulating layers for electric field relaxation that are located at edges of gates of P-type and N-type transistors and made thicker than gates in channel regions in order to reduce electric fields concentrated into the gate edges, and regions for electric field relaxation located to surround the insulating layers for electric field relaxation and drains. In particular, the invention relates to a manufacturing method of a semiconductor element that can optimize withstand voltage levels of P-type and N-type transistors individually by controlling impurity distributions in the regions for electric field relaxation.

2. Related Art

As a method to increase a withstand voltage level of a transistor by controlling a region for electric field relaxation to reduce an electric field in the vicinity of a drain, for example, a technique to form a region for electric field relaxation by heat treatment is known. JP-A-6-29313 is an example of related art. The steps of this technique are: performing wet etching to make a portion corresponding to a region for electric field relaxation of a silicon substrate have the surface orientation (111), implanting boron ions and performing heat treatment at about 1000 degrees centigrade before forming a P-type region for electric field relaxation.

In addition, a technique to reduce a element size by minimizing a length of the region for electric field relaxation is known in a case where a first region and a second region for electric relaxation are involved. This technique can make a element smaller by minimizing an overlapped amount of these two regions for electric relaxation and minimizing a region with a high impurity concentration which does not work effectively for electric relaxation generated parasitically in the overlapped region. JP-A-11-8388 is another example of related art.

According to the former related art technique mentioned above, some improvement of a withstand voltage level for a unipolar transistor can be expected according to the description of a method for manufacturing a P-type transistor. However, it is difficult to improve withstand voltage levels for both of P-type and N-type transistors at the same time although that is required when the P-type and the N-type transistors are formed complementarily. Therefore, in the case where P-type and N-type transistors are used complementarily, a problem that the usage of the voltage is limited to the one that is lower between the two arises.

Further, even if the latter related art technique mentioned above is employed, it is still difficult to improve the withstand voltage levels for P-type and N-type transistors at the same time. Thus the problem that the usage of the voltage is limited to the one that is lower between the two has not been solved.

SUMMARY

An advantage of the invention is to provide a manufacturing method of a complementary MOStransistor capable of withstanding high voltages by optimizing withstand voltage levels for P-type and N-type transistors individually.

According to an aspect of the invention, a method for manufacturing a semiconductor element includes: (1) forming a first insulating layer for electric field relaxation that is thicker than a first gate insulating layer in a first channel region of a transistor of a first conductive type that is one of P-type and N-type polarity formed on a semiconductor silicon wafer to surround an edge of a first gate electrode in order to reduce an electric field concentrated to a region surrounding the edge of the first gate electrode because of a voltage applied to the first gate electrode and a first drain region of the transistor of the first conductive type, and forming a second insulating layer for electric field relaxation that is thicker than a second gate insulating layer in a second channel region of a transistor of a second conductive type to surround the edge of the first gate electrode in order to reduce an electric field concentrated to a region surrounding an edge of a second gate electrode because of a voltage applied to the second gate electrode and a second drain region of the transistor of the second conductive type; (2) forming a first photoresist layer in an uppermost section of the wafer; (3) forming a first resist pattern by performing first photolithography to remove the photoresist layer in a region where ion implantation of an impurity of the first conductive type is to be performed for forming a first region for electric field relaxation so as to surround the drain region of the transistor of the first conductive type and the first insulating layer for electric field relaxation; (4) removing the first resist pattern after the ion implantation of the impurity of the first conductive type by employing the first resist pattern as a mask; (5) performing first heat treatment to diffuse the impurity of the first conductive type; (6) forming a second photoresist layer in an uppermost section of the wafer; (7) forming a second resist pattern by performing second photolithography to remove the second photoresist layer in a region where ion implantation of an impurity of the second conductive type is to be performed for forming a second region for electric field relaxation so as to surround a drain region of the transistor of the second conductive type and the second insulating layer for electric field relaxation; (8) removing the second resist pattern after the ion implantation of the impurity of the second conductive type by employing the second resist pattern as a mask; and (9) performing second heat treatment to form the first region for electric field relaxation and the second region for electric field relaxation. The first region for electric field relaxation is provided by the first heat treatment to diffuse the impurity of the first conductive type in the step (5) and the second heat treatment in the step (9).

By means of this manufacturing method, the time of heat treatment to form each region for electric field relaxation for the transistors of the first conductive type and the second conductive type is individually controllable. The region for electric field relaxation for the first conductive type receives heat treatment longer than the region for electric field relaxation for the second conductive type due to the amount of the time for the first heat treatment in the step (4). Therefore, by changing a condition of the first heat treatment, an ion diffusion amount in the region for electric field relaxation for the first conductive type is changed without affecting an ion diffusion amount of the region for electric field relaxation for the second conductive type. As a result, the withstand voltage levels can be improved by controlling an electric characteristic.

Further, the manufacturing method of a semiconductor element of the present aspect may employ a semi-recessed local oxidation of silicon (LOCOS) layer for each insulating layer for electric field relaxation formed in the step (1).

This manufacturing method enables the insulating layers for electric field relaxation to be formed without extending time for manufacturing steps since the semi-recessed LOCOS layer used as an isolation layer can be also used as the insulating layers for electric field relaxation for the P-type transistor and the N-type transistor.

BRIEF DESCRIPTION OF THE DRAWINGS

The invention will be described with reference to the accompanying drawings, wherein like numbers reference like elements.

DESCRIPTION OF THE EMBODIMENTS

Hereinafter, embodiments of a method for manufacturing a semiconductor element related to the present invention will be described with reference to the accompanying drawings. It should be noted that in each drawing, a different scale is used for each layer and each part on a recognizable size on the drawings.

Structure of P-type and N-type Transistors

Figure 1:
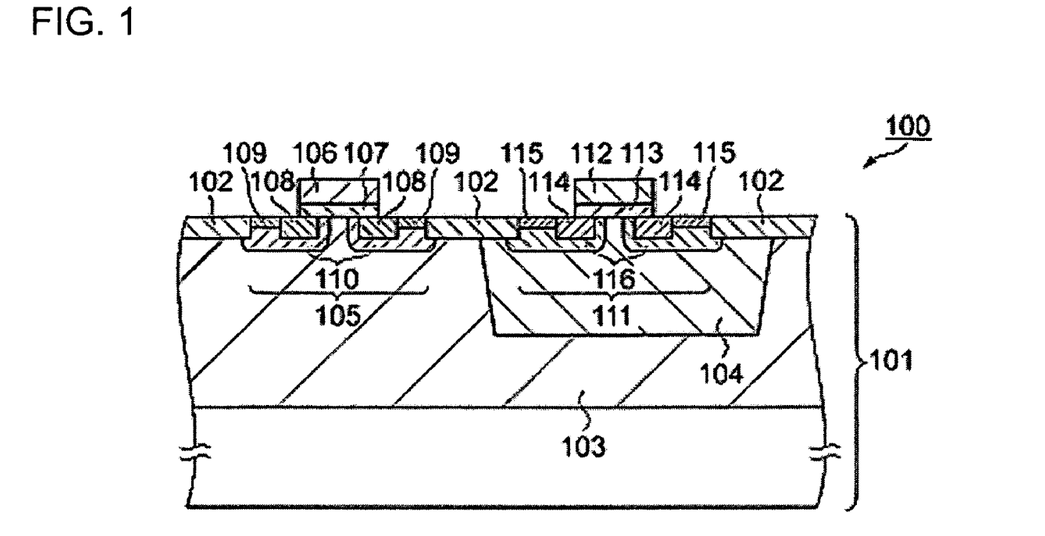
FIG. 1 is a sectional view of a semiconductor element manufactured by a method for manufacturing an embodiment of the present invention.
Figure 2:
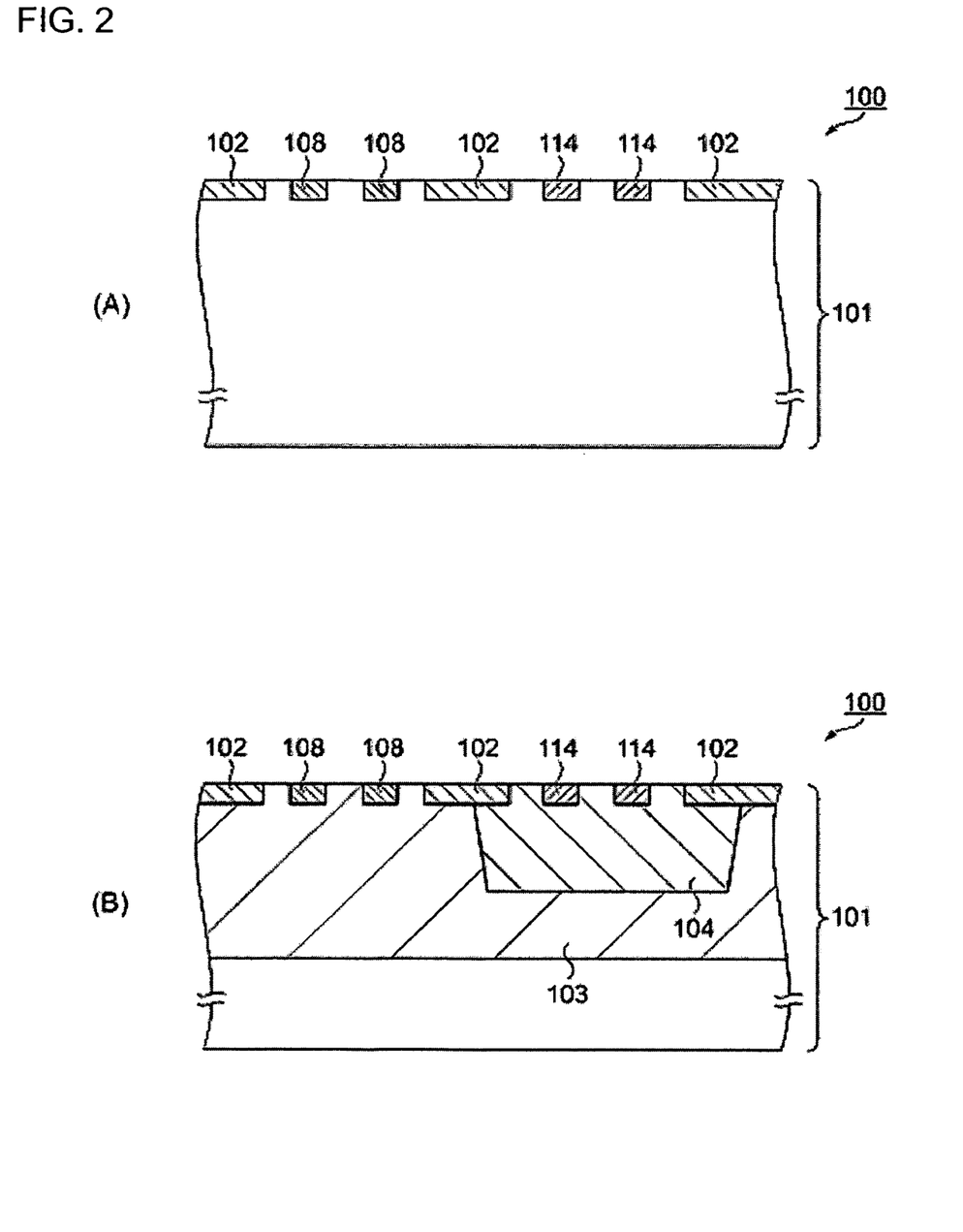
FIGS. 2A and 2B are process sectional views for explaining the method for manufacturing the semiconductor element according to the embodiment of the invention.
Figure 3:
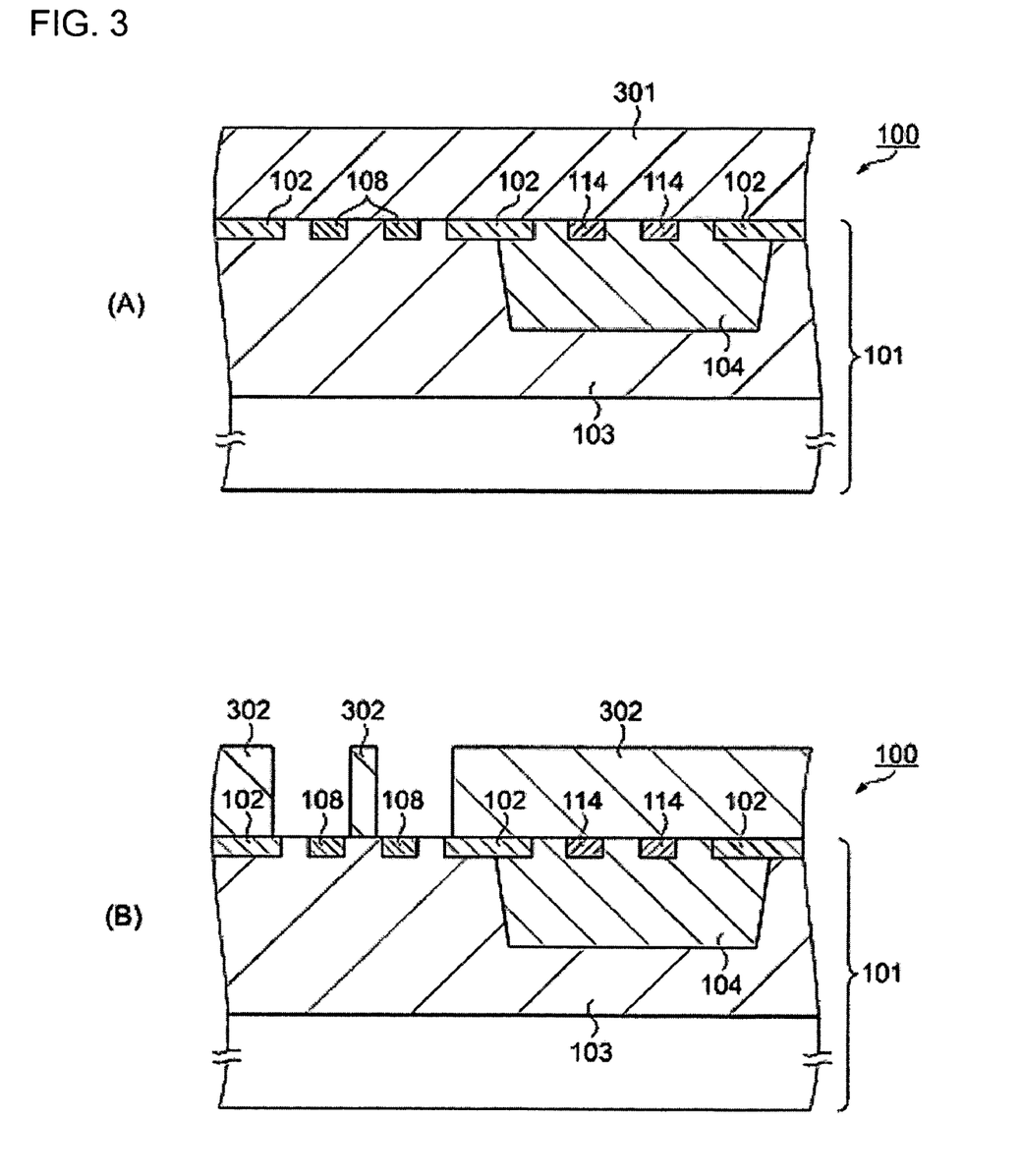
FIGS. 3A and 3B are process sectional views for explaining the method for manufacturing the semiconductor element according to the embodiment of the invention.
Figure 4:
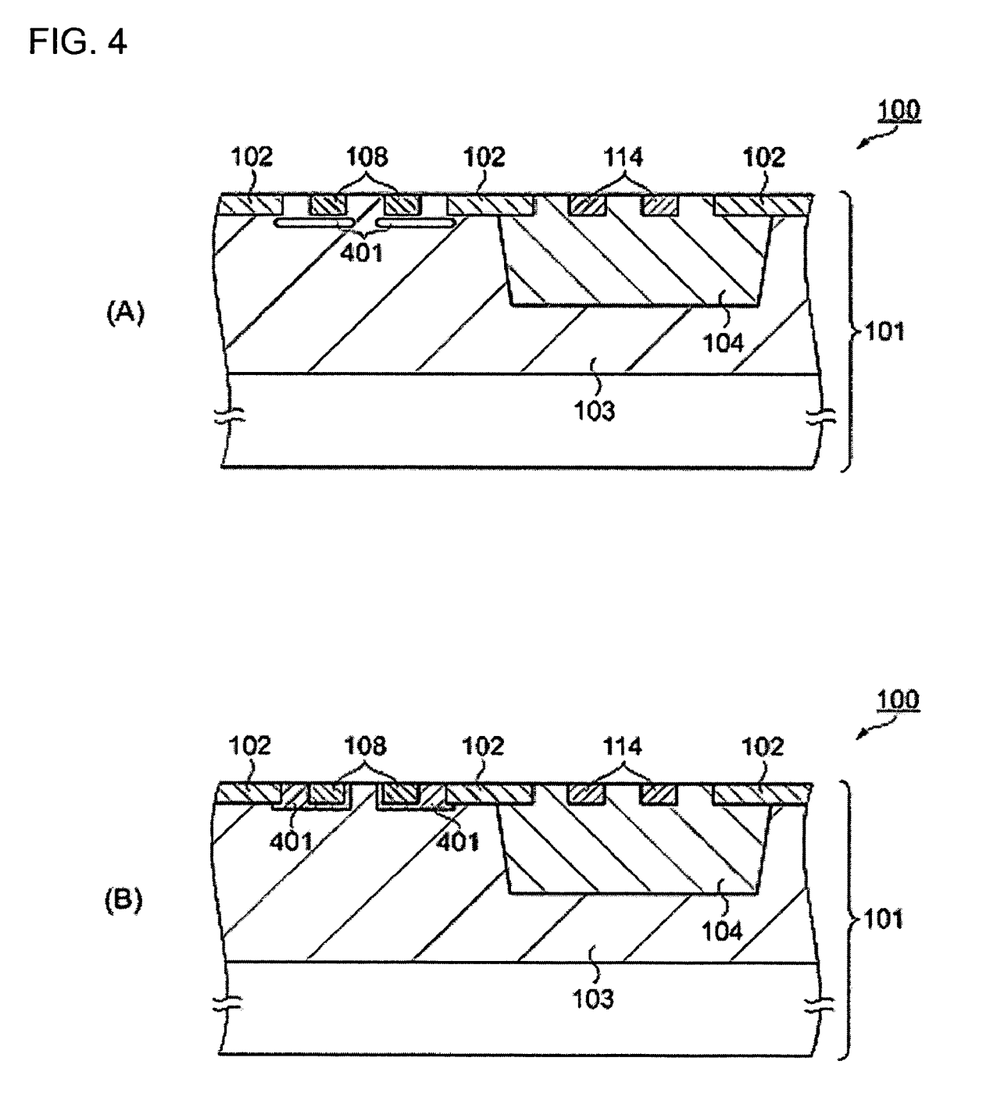
FIGS. 4A and 4B are process sectional views for explaining the method for manufacturing the semiconductor element according to the embodiment of the invention.
Figure 5:
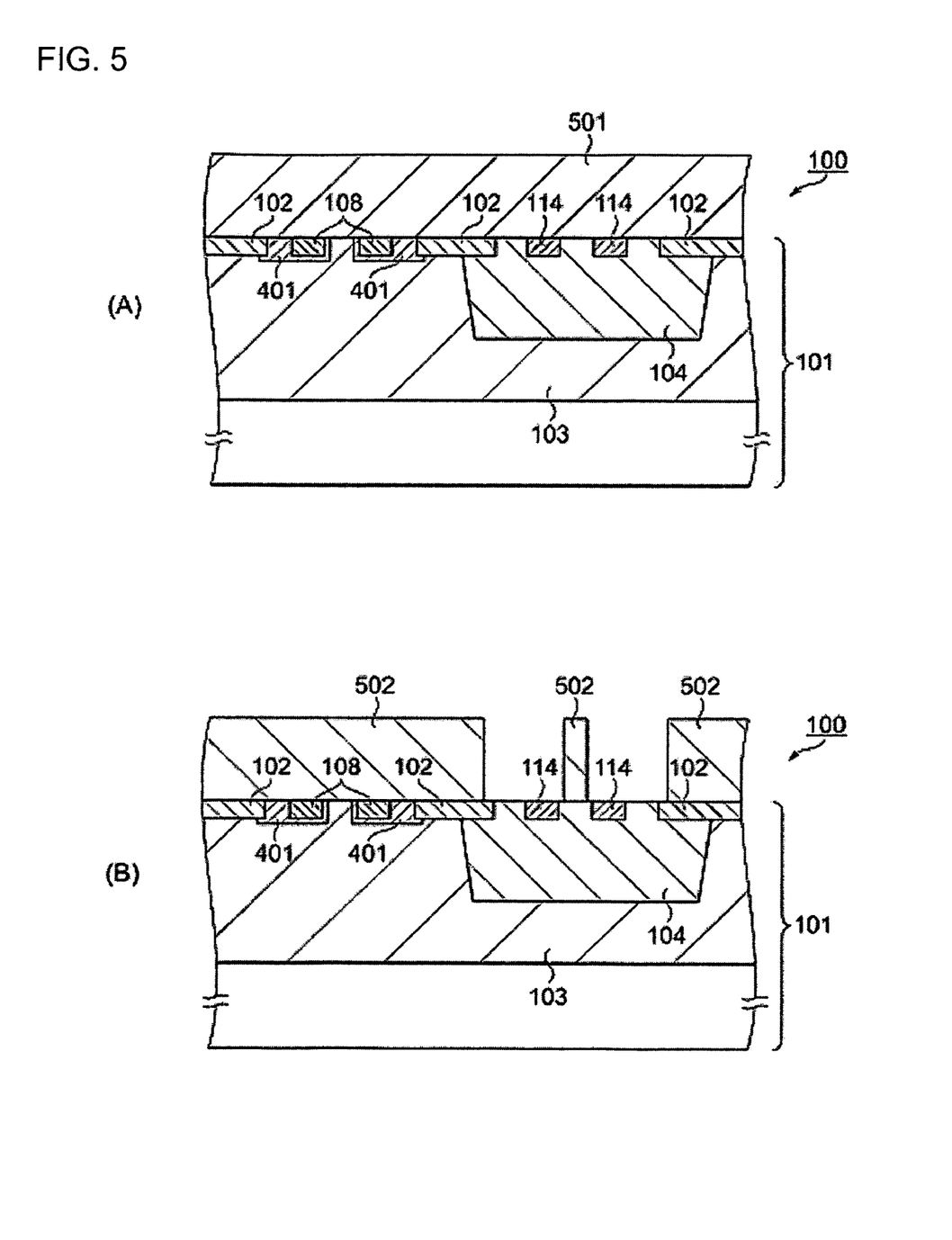
FIGS. 5A and 5B are process sectional views for explaining the method for manufacturing the semiconductor element according to the embodiment of the invention.
Figure 6:
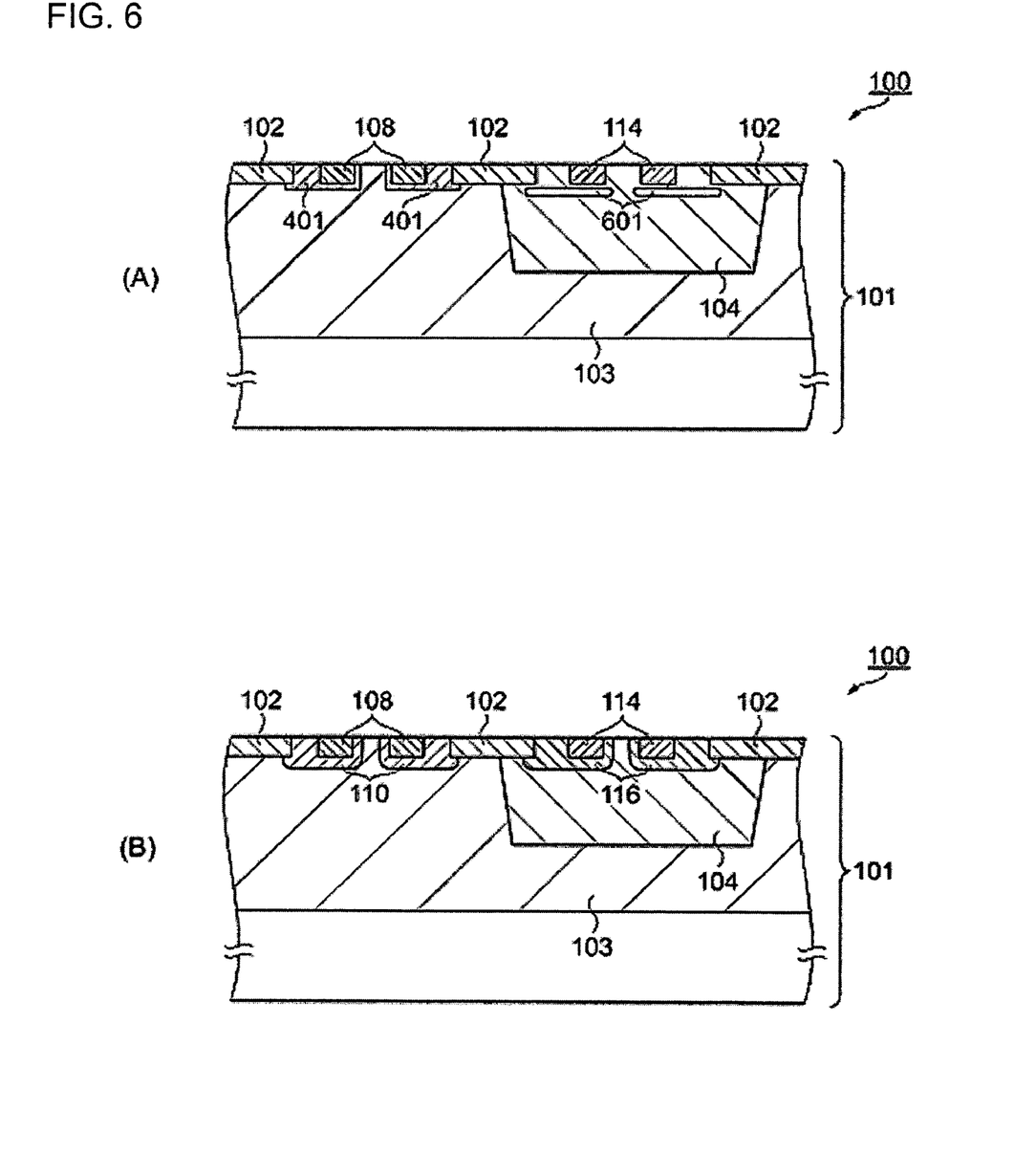
FIGS. 6A and 6B are process sectional views for explaining the method for manufacturing the semiconductor element according to the embodiment of the invention.
Figure 7:
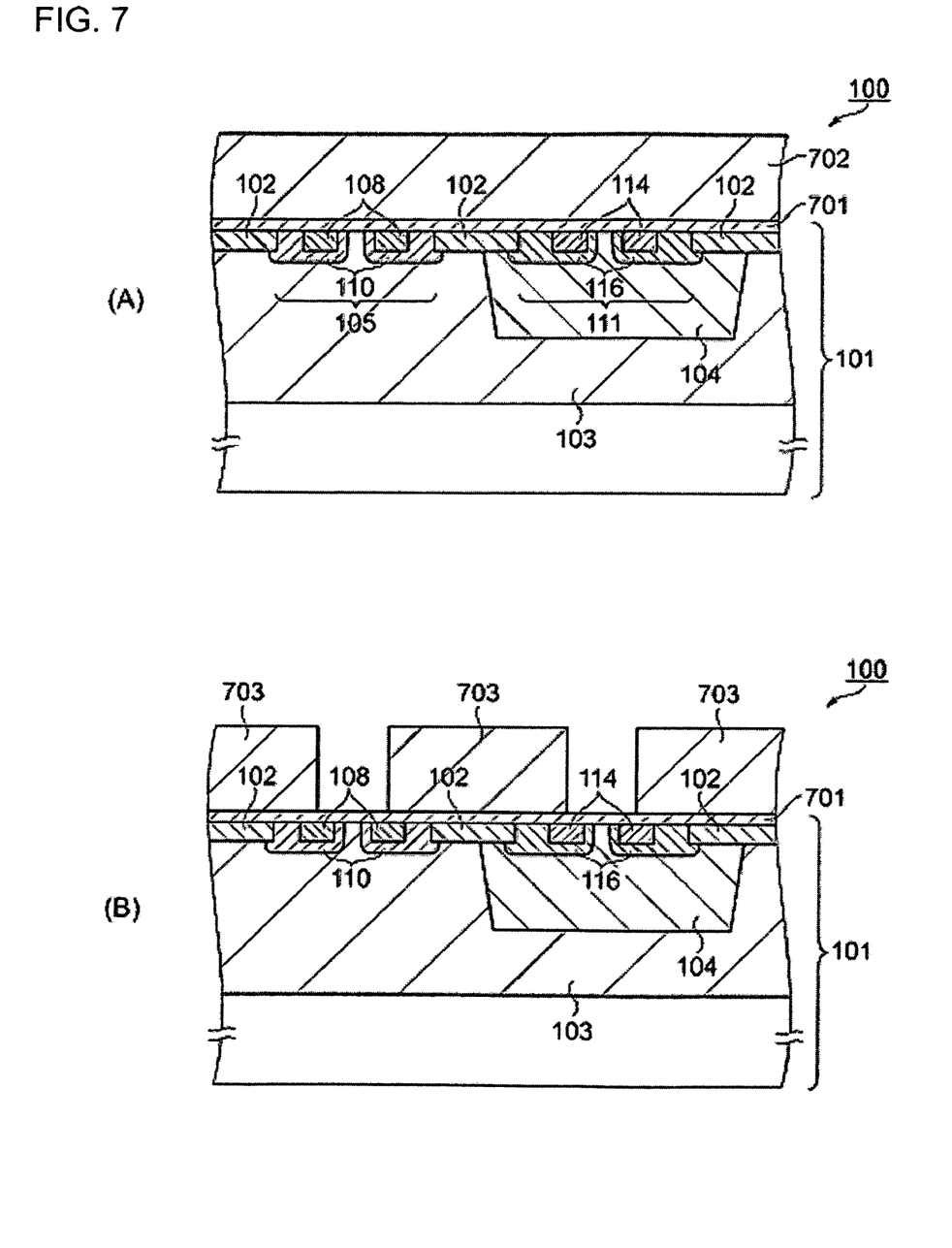
FIGS. 7A and 7B are process sectional views for explaining the method for manufacturing the semiconductor element according to the embodiment of the invention.
Figure 8:
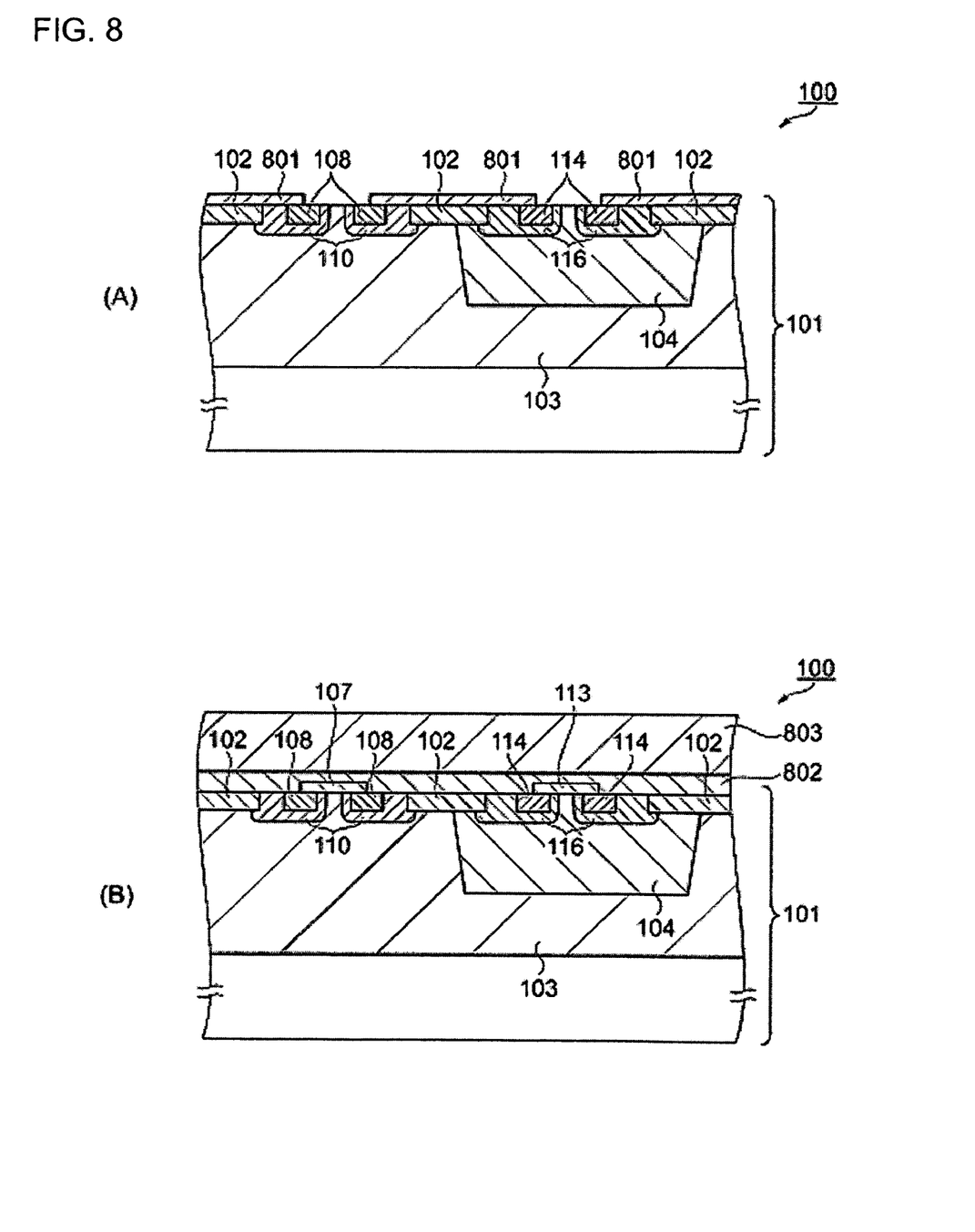
FIGS. 8A and 8B are process sectional views for explaining the method for manufacturing the semiconductor element according to the embodiment of the invention.
Figure 9:
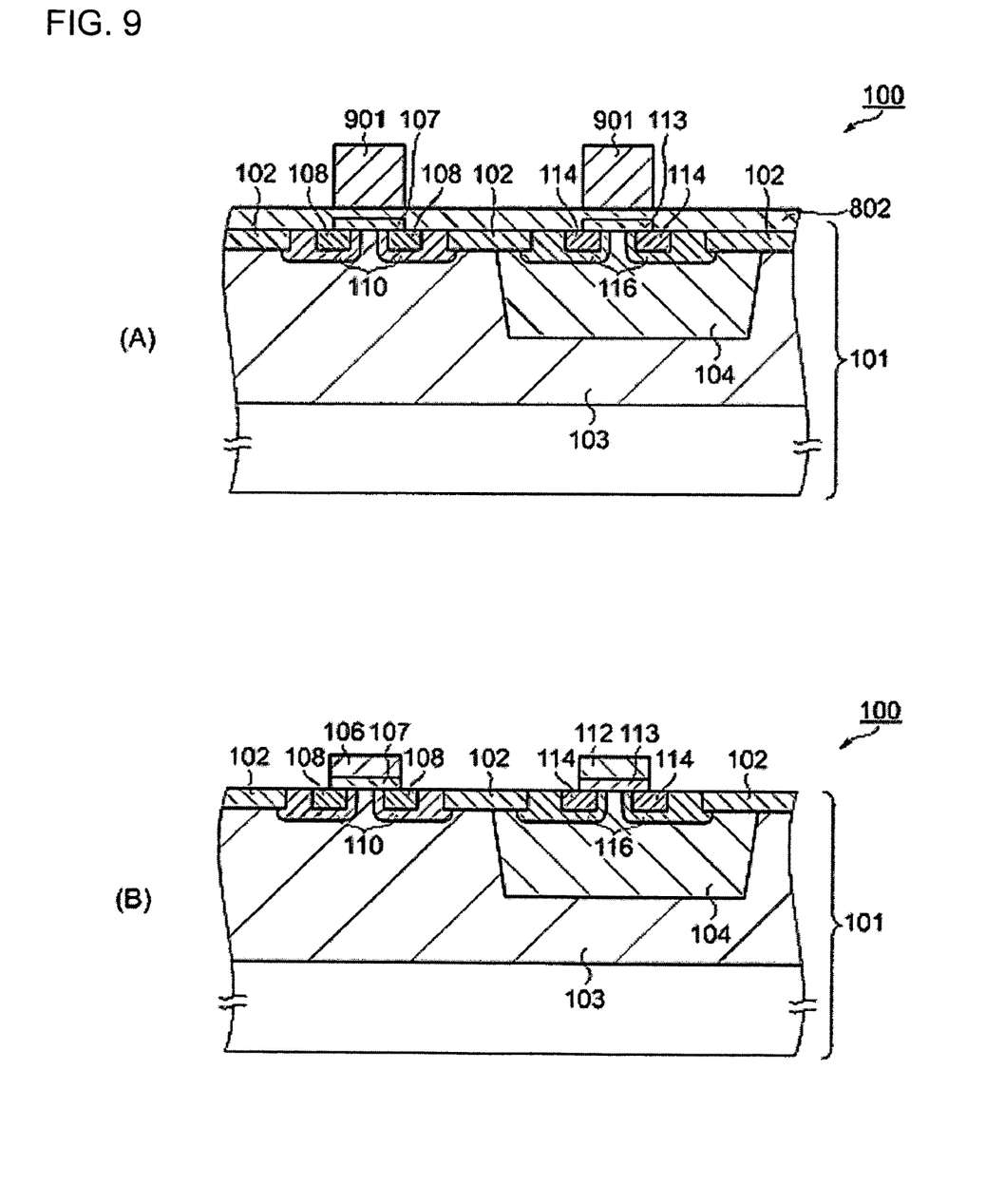
FIGS. 9A and 9B are process sectional views for explaining the method for manufacturing the semiconductor element according to the embodiment of the invention.

FIG. 1 is a sectional view of a semiconductor element manufactured by a manufacturing method according to an embodiment of the present invention.

A P-type silicon substrate 101 is provided by forming a semi-recessed LOCOS (hereinafter, abbreviated as SRL) layer 102 which is about 300 nm in thickness on a semiconductor silicon wafer 100. In the P-type silicon substrate 101, an N well 103 that is about 12 μm in depth is formed through a diffusion process at 1200 degrees centigrade for 24 hours. Inside of the N well 103, a P well 104 which is about 5 μm in depth is formed through a diffusion process at 1200 degrees centigrade for 12 hours.

In the N well 103, a P-type transistor 105 is formed. The P-type transistor 105 includes a P-type gate electrode 106, a P-type gate insulating layer 107, a P-type insulating layer 108 for electric field relaxation, a P-type drain region 109 and a P-type region 110 for electric field relaxation. The P-type gate electrode 106 is made of polysilicon. The P-type gate insulating layer 107 is made of silicon oxide and about 160 nm in thickness. The P-type insulating layer 108 for electric field relaxation is served by an SRL layer 102 formed in the vicinity of both edges of the P-type gate electrode 106. The P-type drain region 109 is formed for electrical connection. The P-type region 110 for electric field relaxation is formed to surround the P-type drain region 109 and the P-type insulating layer 108 for electric field relaxation.

In the same way, an N-type transistor 111 is formed in the P well 104. The N-type transistor 111 includes an N-type gate electrode 112, an N-type gate insulating layer 113, an N-type insulating layer 114 for electric field relaxation, an N-type drain region 115 and an N-type region 116 for electric field relaxation. The N-type gate electrode 112 is made of polysilicon. The N-type gate insulating layer 113 is made of silicon oxide and about 160 nm in thickness. The N-type insulating layer 114 for electric field relaxation is served by the SRL layer 102 formed in the vicinity of both edges of the N-type gate electrode 112. The N-type drain region 115 is formed for electrical connection. The N-type region 116 for electric field relaxation is formed to surround the N-type drain region 115 and the N-type insulating layer 114 for electric field relaxation.

The P-type insulating layer 108 for electric field relaxation improves a withstand voltage level of the P-type transistor 105 by reducing electric field concentration at gate edges caused by a potential difference between the P-type gate electrode 106 and the P-type drain region 109.

Impurity concentration of the P-type region 110 for electric field relaxation is kept lower than that of the P-type drain region 109 and this makes a depletion layer to receive a voltage applied easy to extend. As a result, the withstand voltage level of the P-type transistor 105 is improved.

Similarly, as impurity concentration of the N-type region 116 for electric field relaxation is kept lower than that of the N-type drain region 115, a depletion layer to receive a voltage applied is easy to extend. As a result, the withstand voltage level of the N-type transistor 111 is improved.

Optimization of impurity distributions in the P-type region 110 for electric field relaxation and the N-type region 116 for electric field relaxation is an important factor in order to improve the withstand voltage levels. This is because the voltages applied to the P-type transistor 105 and the N-type transistor 111 work upon the P-type region 110 for electric field relaxation and the N-type region 116 for electric field relaxation, respectively.

Manufacturing Process of P-type and N-type Transistors

Now, a manufacturing process to form the P-type transistor 105 and the N-type transistor 111 will be described. FIGS. 2 through 10 are process sectional views for explaining a method for manufacturing a semiconductor element according to the present embodiment of the invention.

First, the SRL layer 102 which is about 400 nm in thickness is formed using a known technique as shown in FIG. 2A. The SRL layer 102 is formed in an isolation region. In addition, it is also formed in the vicinity of gate edges of the P-type gate electrode 106 and the N-type gate electrode 112 as shown FIG. 1. This is because the SRL layer 102 acts as both the P-type insulating layer 108 and the N-type insulating layer 114 for electric field relaxation.

Then, the N well 103 and the P well 104 are formed as shown in FIG. 2B. Phosphorus ions to form the N well 103 are selectively implanted into the P-type silicon substrate 101 using a photolithography process or the like, and then thermal diffusion is performed at 1200 degree centigrade for 12 hours, for example. Subsequently, boron ions to form the P well 104 are selectively implanted into a region to be the N well 103 using the photolithography process or the like in the same manner, and then thermal diffusion is performed at 1200 degree centigrade for 12 hours, for example.

There is no large difference in diffusion coefficients of phosphorus and boron in silicon. Therefore, ions in the N well 103 are diffused more deeply than ones in the P well 104. This is because the diffusion process at 1200 degrees centigrade for 12 hours is performed to the N well 103 twice (24 hours in total) whereas the same diffusion process is performed to the P well 104 once. Accordingly, the P well 104 is formed in the N well 103.

Then, a photoresist layer 301 is formed by applying photoresist on the whole surface of the wafer 100 as shown in FIG. 3A.

Next, as shown in FIG. 3B, a resist pattern 302 is formed by first photolithography to remove the photoresist layer 301 in regions covering the P-type insulating layer 108 for electric field relaxation and the P-type drain region 109 shown in FIG. 1.

Then, as shown in FIG. 4A, boron ions are implanted with acceleration energy to penetrate through the P-type insulating layer 108 for electric field relaxation and the P-type drain region 109 shown in FIG. 1 to form a boron doped region 401. The accelerating voltage can be about 200 keV, for example. After the implementation of the boron ions, the resist pattern 302 that becomes unnecessary is removed.

Next, as shown in FIG. 4B, thermal diffusion is performed to the boron doped region 401 as first heat treatment at 1100 degrees centigrade for 3 hours.

Then, a photoresist layer 501 is formed by applying photoresist on the whole surface of the wafer 100 as shown in FIG. 5A.

Next, a resist pattern 502 is formed by removing the photoresist layer 501 in regions covering the N-type insulating layer 114 for electric field relaxation shown in FIG. 5B and the N-type drain region 115 shown in FIG. 1 by a second photolithography.

Then, as shown in FIG. 6A, phosphorus ions are implanted with acceleration energy to penetrate through the N-type insulating layer 114 for electric field relaxation and the N-type drain region 115 shown in FIG. 1 to form the phosphorus doped region 601. The accelerating voltage can be about 400 keV, for example. After the implantation of phosphorus ions, the resist pattern 502 that becomes unnecessary is removed.

Next, as shown in FIG. 6B, second heat treatment is performed at 1100 degrees centigrade for 3 hours as thermal diffusion of phosphorus and boron ions to form the N-type insulating layer 116 for electric field relaxation and the P-type insulating layer 110 for electric field relaxation, respectively. The implanted phosphorus ions in this process form the N-type region 116 for electric field relaxation simply by the second heat treatment at 1100 degrees centigrade for 3 hours. On the other hand, the implanted boron ions form the P-type region 110 for electric field relaxation by both of the first and the second heat treatments each of which is thermal diffusion at 1100 degrees centigrade for 3 hours. By performing heat treatments in this way, the impurity distributions of the N-type region 116 for electric field relaxation and the P-type region 110 for electric field relaxation become controllable individually. Accordingly, the withstand voltage levels of the P-type transistor 105 and the N-type transistor 105 shown in FIG. 1 can be optimized individually.

The method to perform heat treatments all at once (performing the second heat treatment only) cannot provide a complementary MOS transistor that withstands up to 50 V because the withstand voltage of the P-type transistor 105 shown in FIG. 1 is 48 V and the withstand voltage of the N-type transistor 111 in FIG. 1 is 57 V. However, the technique according to the present embodiment that optimizes the withstand voltage levels by providing the first and the second treatments separately enables the withstand voltage level of the P-type transistor 105 to improve from 48 V to 54 V. Furthermore, the withstand voltage level of the N-type transistor 111 is sustained as it was in related art, because the heat history of the N-type transistor 111 is the second heat treatment only. It enables providing a complementary transistor that withstands a supply voltage of 50 V having the P-type transistor 105 with a withstand voltage of 54 V and the N-type transistor 111 with a withstand voltage of 57 V.

Then, an impurity for threshold control is doped to regions which will be the P-type transistor 105 and the N-type transistor 111 by an ion implanting method or the like as shown in FIG. 7A when necessary. Then, a silicon nitride layer 701 is formed on the whole surface of the wafer 100. Subsequently, a photoresist layer 702 is formed by applying photoresist on the whole surface of the wafer 100.

Next, a resist pattern 703 is formed by removing the photoresist layer 702 in regions covering the P-type insulating layer 108 and the N-type insulating layer 114 for electric field relaxation as shown in FIG. 7B.

After a nitride silicon layer pattern 801 is formed by etching the nitride silicon layer 701 using a resist pattern 703 as a mask as shown in FIG. 8A, the resist pattern 703 that becomes unnecessary is removed.

Next, as shown in FIG. 8B, the P-type gate insulating layer 107 and the N-type gate insulating layer 113 are selectively formed to make their silicon oxide layers approximately 160 nm in thickness by a thermal oxidation method using the nitride silicon layer pattern 801 as a mask. After the thermal oxidation is completed, the nitride silicon layer 801 that becomes unnecessary is removed. After the nitride silicon layer 801 is removed, a polysilicon layer 802 and a photoresist layer 803 are sequentially deposited on silicon oxide formed collaterally by a manufacturing process of other elements.

Then, as shown in FIG. 9A, a resist pattern 901 is formed by removing the photoresist layer 803 except for regions covering the P-type gate insulating layer 107 and the N-type gate insulating layer 113.

After the P-type gate electrode 106 and the N-type gate electrode 112 are formed by etching the polysilicon layer 802 using the resist pattern 901 as a mask as shown in FIG. 9B, the resist pattern 901 that becomes unnecessary is removed.

Figure 10:
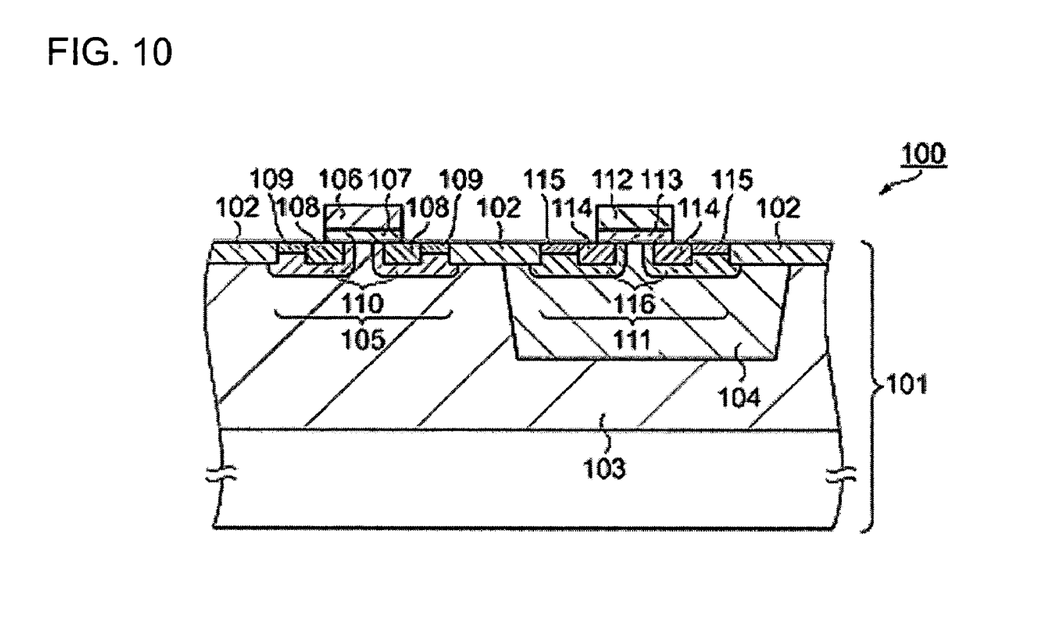
FIG. 10 is a process sectional view for explaining the method for manufacturing the semiconductor element according to the embodiment of the invention.

Next, the P-type drain region 109 is created by a photolithography method and ion implantation as shown in FIG. 10. Subsequently, the N-type drain region 115 is formed by the same steps.

By the implementation of the manufacturing process described above, the structure shown in FIG. 1 is obtained.

Now, advantageous effects of the present embodiment will be described below.

The first and the second heat treatments are performed to the P-type region 110 for electric field relaxation whereas only the second heat treatment is performed to the N-type region 116 for electric field relaxation; so that the ion diffusion amount by the heat treatments for the P-type region 110 and the N-type region 116 are individually controllable. As a result, compared to the case where the heat treatment is performed to the both regions all at once in the same step, concentration distributions for the P-type region 110 and the N-type region 116 become individually controllable.

Although the method performing the heat treatment all at once (the second heat treatment only) can provide the manufacturing process to improve the withstand voltage level of the N-type transistor 111 up to 57 V, the manufacturing process cannot provide a complementary transistor that withstands up to 50 V because the withstand voltage of the P-type transistor 105 is up to 48 V only. However, the technique according to the present embodiment that optimizes the withstand voltage level by performing the first and the second heat treatments separately enables the withstand voltage level of the P-type transistor 105 to improve from 48 V to 54 V. In addition, the withstand voltage level of the N-type transistor 111 is sustained as it was in related art because the heat history of the N-type transistor 111 is the second heat treatment only. As a result, it enables providing a complementary transistor that can withstand a supply voltage of 50 V as the withstand voltage of the P-type transistor 105 is 54 V and the withstand voltage of the N-type transistor 111 is 57 V.

Furthermore, the P-type insulating layer 108 for electric field relaxation and the N-type insulating layer 114 for electric field relaxation are served by the SRL layer 102 for isolating elements. Therefore, there is no need to form an insulating layer for electric field relaxation newly and the process can be shortened.

Now, modification examples of the present invention will be described.

In the present embodiment, the withstand voltage levels of the P-type transistor 105 and the N-type transistor 111 are coordinated by increasing the ion diffusion amount in the P-type region 110 for electric field relaxation more than that in the N-type region 116 for electric field relaxation. However, there may be a case where increasing an ion diffusion amount in the N-type region for electric field relaxation is preferable depending on structures. In this case, ion implantation to form the N-type region 116 for electric field relaxation can be performed before the first heat treatment.

Although both the first and the second heat treatments are performed in the same condition, i.e., at 1100 degrees centigrade for 3 hours, in the present embodiment, different conditions can be employed.

The P-type gate electrode 106 and the N-type gate electrode 112 are used as gate electrodes for the P-type transistor 105 and the N-type transistor 111, respectively. Alternatively, an N-type polysilicon material can be employed for both the P-type gate electrode 106 and the N-type gate electrode 112, or a P-type polysilicon material can be employed instead. Furthermore, metal can also be employed instead of polysilicon.

The entire disclosure of Japanese Patent Application No. 2005-177310, filed Jun. 17, 2005 is expressly incorporated by reference herein.

What is claimed is:

1. A method for manufacturing a semiconductor element, comprising:

(1) forming a first insulating layer for electric field relaxation that is thicker than a first gate insulating layer in a first channel region of a transistor of a first conductive type that is one of P-type and N-type polarity formed on a semiconductor silicon wafer to surround an edge of a first gate electrode in order to reduce an electric field concentrated to a region surrounding the edge of the first gate electrode because of a voltage applied to the first gate electrode and a first drain region of the transistor of the first conductive type, and forming a second insulating layer for electric field relaxation that is thicker than a second gate insulating layer in a second channel region of a transistor of a second conductive type to surround the edge of the first gate electrode in order to reduce an electric field concentrated to a region surrounding an edge of a second gate electrode because of a voltage applied to the second gate electrode and a second drain region of the transistor of the second conductive type;

(2) forming a first photoresist layer in an uppermost section of the wafer;

(3) forming a first resist pattern by performing first photolithography to remove the photoresist layer in a region where ion implantation of an impurity of the first conductive type is to be performed for forming a first region for electric field relaxation so as to surround the drain region of the transistor of the first conductive type and the first insulating layer for electric field relaxation;

(4) removing the first resist pattern after the ion implantation of the impurity of the first conductive type by employing the first resist pattern as a mask;

(5) performing first heat treatment to diffuse the impurity of the first conductive type;

(6) forming a second photoresist layer in an uppermost section of the wafer;

(7) forming a second resist pattern by performing second photolithography to remove the second photoresist layer in a region where ion implantation of an impurity of the second conductive type is to be performed for forming a second region for electric field relaxation so as to surround the drain region of the transistor of the second conductive type and the second insulating layer for electric field relaxation;

(8) removing the second resist pattern after the ion implantation of the impurity of the second conductive type by employing the second resist pattern as a mask; and (9) performing second heat treatment to form the first region for electric field relaxation and the second region for electric field relaxation;

the first region for electric field relaxation being provided by the first heat treatment to diffuse the impurity of the first conductive type in (5) and the second heat treatment in (9).

2. The method for manufacturing a semiconductor element according to claim 1, wherein each insulating layer for electric field relaxation formed in (1) is a semi-recessed local oxidation of silicon layer.

* * * * *